(12) United States Patent
Shizuno (10) Patent No.: US 6,841,884 B2
(45) Date of Patent: Jan. 11, 2005

(54) SEMICONDUCTOR DEVICE (75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/702,561

(22) Filed: Nov. 7, 2003

(65) Prior Publication Data

US 2004/0089936 A1 May 13, 2004

(30) Foreign Application Priority Data

Nov. 12, 2002 (JP) ........................................ 2002-327662

(51) Int. Cl.⁷ ............................................. H01L 23/48
(52) U.S. Cl. ........................ 257/777; 257/693; 257/685; 257/787
(58) Field of Search ................................ 257/777, 723, 257/781, 784, 787, 693

(56) References Cited

U.S. PATENT DOCUMENTS

| | | | | |
|---|---|---|---|---|
| 5,565,706 A | * | 10/1996 | Miura et al. ................. | 257/723 |
| 5,701,032 A | * | 12/1997 | Fischer et al. .............. | 257/692 |
| 5,866,949 A | * | 2/1999 | Schueller .................... | 257/778 |
| 5,874,782 A | * | 2/1999 | Palagonia ................... | 257/778 |
| 5,898,223 A | * | 4/1999 | Frye et al. .................. | 257/777 |
| 6,054,773 A | * | 4/2000 | Ohsawa et al. ............. | 257/783 |
| 6,060,768 A | * | 5/2000 | Hayashida et al. ......... | 257/666 |
| 6,281,570 B1 | * | 8/2001 | Kameyama et al. ........ | 257/697 |
| 6,380,629 B1 | * | 4/2002 | Kim ............................ | 257/777 |
| 6,407,451 B2 | * | 6/2002 | Akram et al. ............... | 257/698 |
| 6,407,459 B2 | * | 6/2002 | Kwon et al. ................ | 257/780 |
| 6,414,382 B1 | * | 7/2002 | Hashimoto ................... | 257/676 |
| 6,414,396 B1 | * | 7/2002 | Shim et al. ................. | 257/778 |
| 6,717,252 B2 | * | 4/2004 | Saeki .......................... | 257/686 |
| 6,765,277 B2 | * | 7/2004 | Chen et al. ................. | 257/459 |

FOREIGN PATENT DOCUMENTS

| | | |
|---|---|---|
| EP | 0915505 | 5/1999 |
| JP | 10-256417 | 9/1998 |
| JP | 11-219984 | 8/1999 |

* cited by examiner

Primary Examiner—Jasmine Clark
(74) Attorney, Agent, or Firm—Rabin & Berdo, P.C.

(57) ABSTRACT

A semiconductor device includes a substrate having a chip mounting surface and a package surface. The semiconductor chip is mounted on the substrate and has electrode pads formed on a circuit forming surface thereof. The chip also has an insulating layer formed on the circuit forming surface and includes an opening for exposing the surface of electrode pads, conductive posts over the insulating layer, and re-distribution wirings formed on the insulating layer. The device has further has external terminals disposed on the package surface; substrate pads formed on the chip mounting surface, internal wirings formed on the chip mounting surface, and a sealing resin for sealing the chip mounting surface and the semiconductor chip.

14 Claims, 4 Drawing Sheets

SEMICONDUCTOR DEVICE OF SECOND EMBODIMENT OF THE PRESENT INVENTION

FIG. 1A

PLAN OF SEMICONDUCTOR CHIP

FIG. 1B

SEMICONDUCTOR DEVICE OF FIRST EMBODIMENT OF THE PRESENT INVENTION

FIG. 1C

PRIOR-ART SEMICONDUCTOR DEVICE

FIG. 2

MANUFACTURING METHOD OF FIG. 1

FIG. 3

SEMICONDUCTOR DEVICE OF SECOND EMBODIMENT OF
THE PRESENT INVENTION

FIG. 4

SEMICONDUCTOR DEVICE

BACKGROUND OF THE INVENTION

1. Field of the Invention

The present invention relates to a semiconductor device, particularly to a semiconductor device of a surface package type including a redistribution wiring and conductive post, and to a method of manufacturing the same.

This application is a counterpart of Japanese patent application, Serial Number 327662/2002, filed Nov. 12, 2002, the subject matter of which is incorporated herein by reference.

2. Description of the Related Art

With miniaturization of a portable apparatus, there has been a demand for miniaturization of a semiconductor device mounted on the apparatus. To meet this demand, the semiconductor device referred to as a chip size package (CSP) which has substantially the same size as an outer dimension of a semiconductor chip has appeared. Examples of a mode of CSP include a wafer-level chip size/scale package (WCSP), and a multi chip package (MCP) in which a plurality of semiconductor chips are embedded in one package.

Figure 2:
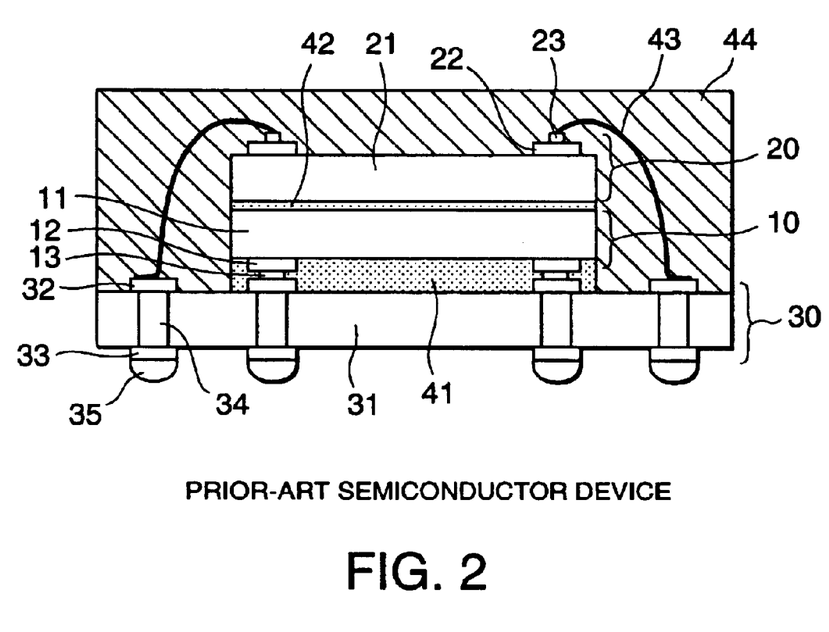
FIG. 2 is a schematic sectional view showing the semiconductor device which has a prior-art MCP structure.

FIG. 2 is a schematic sectional view showing the semiconductor device having a prior-art MCP structure described in Patent Document 1 (Japanese Patent Application Laid-Open No. 11-219984, FIG. 1). Since FIG. 2 is a schematic sectional view, for the convenience of description, reference numerals in FIG. 2 do not agree with those in Patent Document 1.

This semiconductor device is of an MCP type which includes a first chip 10 and second chip 20 and in which these chips are stacked/mounted on a substrate 30 and whose surface is resin-sealed.

In the first chip 10, gold bumps 13 for connection are formed on a bonding pad 12 disposed in the surface of a semiconductor substrate 11, that is, a circuit forming surface. In the second chip 20, bonding pads 22 are formed in the circuit forming surface of a semiconductor substrate 21.

The first chip 10 and second chip 20 are mounted on the substrate 30, and electrically/mechanically connected to a printed wiring board via the substrate. Bonding pads 32 are formed on the chip mounting surface of an insulating base material 31, and ball pads 33 are formed in an external connection surface. The bonding pads 32 are disposed opposite to the ball pads 33 via the base material 31, and the pads are connected to each other via each conductive via posts 34. Moreover, solder bumps 35 to be connected to the printed wiring board are formed on the ball pads 33.

The substrate 30 is flip-chip connected to the first chip 10. That is, the circuit forming surface of the first chip 10 is mounted opposite to the chip mounting surface of the substrate 30. The bonding pads 32 on a substrate 30 side are electrically connected to the bonding pads 12 on a first chip side by the gold bumps 13. Furthermore, the substrate 30 is fixed to the first chip 10 by an anisotropically conductive or non-conductive adhesive 41.

The back surface of the second chip 20 is fixed to that of the first chip 10 by an adhesive 42. The bonding pads 22 of the second chip 20 surface are connected to the bonding pads 32 of the substrate 30 by wires 43 such as gold wires using a wire bonding technique. Gold balls 23 generated at a time of wire bonding are formed on the bonding pads 22. Moreover, the first chip 10, second chip 20, and wires 43 are sealed with a seal resin 44, and protected from an external environment.

However, the prior-art semiconductor device has the following two problems.

A first problem is that an adhesive 41 is used to fix the first chip 10 to the substrate 30. Since the adhesive 41 generally has hygroscopicity, the adhesive absorbs moisture in a manufacturing process of a package or under use environment of the completed package, and easily peels. Furthermore, when this semiconductor device is mounted on a printed wiring board and connected to the board by reflow, the moisture absorbed in the adhesive 41 forms water vapor and explodes by the heat of reflow. This causes a problem that the semiconductor device breaks and the substrate 30 is disconnected from the first chip 10. Another problem is that a long processing time for adding pressure and temperature to harden the adhesive 41 is required, and mass productivity is inferior.

A second problem is that the first chip 10 is flip-chip connected to the substrate 30. Therefore, the positions of the bonding pads 12 of the first chip 10 need to have a one-to-one correspondence with those of the bonding pads 32 of the substrate 30. An interval between the bonding pads 12 of the first chip 10 tends to be narrowed by an increase of integration or the number of signal lines for external connection, but there is a limitation in narrowing the interval between the bonding pads 32 of the substrate 30 (the interval is about 100 μm in a general substrate, and about 70 μm in a built-up substrate). Therefore, the number of bonding pads 12 of the first chip 10 is large. When a pitch is narrow, there is a problem that a flip-chip structure shown in FIG. 2 cannot be employed.

SUMMARY OF THE INVENTION

The present invention has been developed to solve the above-described problems of the prior art, and an object thereof is to provide a semiconductor device which is superior in water vapor resistance and reflow resistance and which can firmly be connected to a large number of terminals, and a manufacturing method of the device.

To solve the problem, according to one aspect of the present invention, there is provided a semiconductor device which includes a substrate having a chip mounting surface and a package surface; a semiconductor chip mounted on the chip mounting surface; wherein the semiconductor chip includes; a plurality of electrode pads formed on a circuit forming surface of the semiconductor chip, an insulating layer which is formed on the circuit forming surface and which includes an opening for exposing a part of the surface of each electrode pad, a plurality of conductive posts disposed over the insulating layer, and re-distribution wirings formed on the insulating layer to electrically connect the conductive posts to the electrode pads, external terminals disposed on the package surface; substrate pads formed on the chip mounting surface so as to correspond the conductive posts; internal wirings formed on the chip mounting surface to electrically connect the substrate pads and the external terminals; and a sealing resin for sealing the chip mounting surface and the semiconductor chip.

According to another aspect of the present invention, there is provided a method of manufacturing a semiconductor device which includes: providing a semiconductor wafer; forming integrated circuits on a surface of the semiconductor wafer; forming an insulating layer over the integrated circuits; forming re-distribution wirings on the insulating layer so as to electrically connect the integrated circuits; forming conductive posts on the re-distribution wirings; cutting the semiconductor wafer to divide the semiconductor wafer into individual semiconductor chips; providing a substrate having substrate pads; mounting the semiconductor chips on the substrate via the conductive posts; sealing the surface of the substrate and the semiconductor chips with a resin; and cutting the resin and the substrate to obtain individual semiconductor devices.

According to another aspect of the present invention, in the above mentioned aspect of the present invention, the mounting the semiconductor chips includes press-attaching the substrate pads to the conductive posts.

According to still another aspect of the present invention, in the above mentioned aspect of the present invention, the mounting the semiconductor device comprises bonding the substrate pads to the conductive posts by a conductive adhesive or solder.

DETAILED DESCRIPTION OF THE PREFERRED EMBODIMENTS

First Embodiment

Figure 1A:
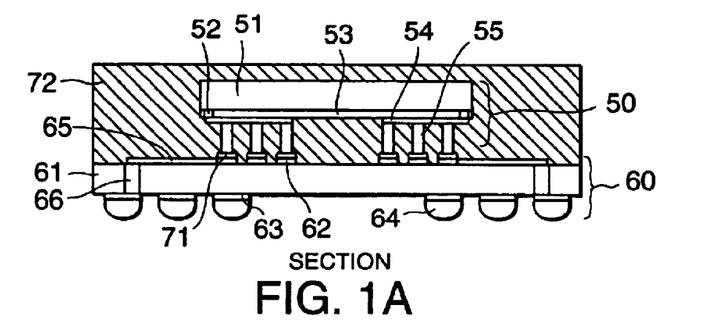
FIGS. 1A to 1C are constitution diagrams of a semiconductor device according to a first embodiment of the present invention.
Figure 1B:
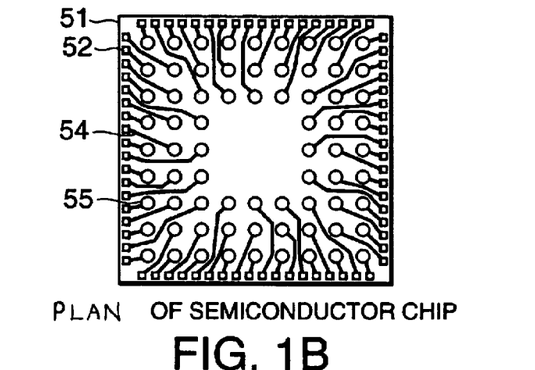
Figure 1C:
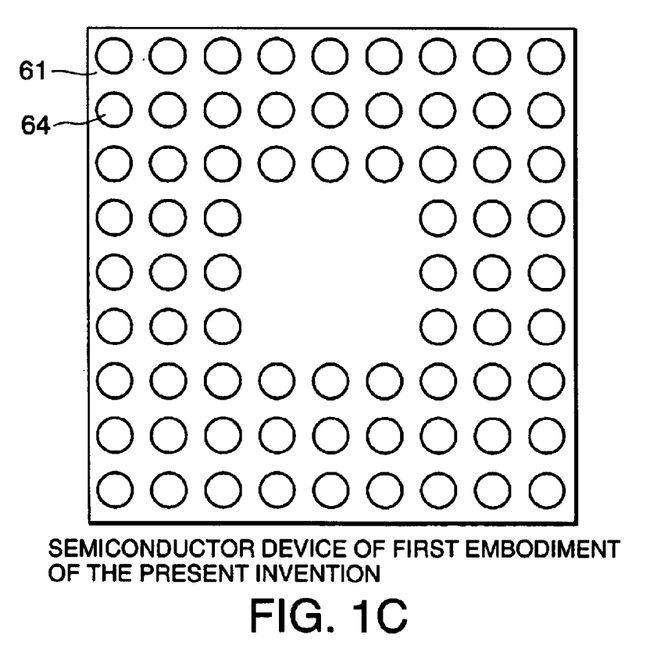

FIGS. 1A to 1C are constitution diagrams of a semiconductor device according to a first embodiment of the present invention, FIG. 1A is a sectional view, FIG. 1B is a plan view of a semiconductor chip seen on a post electrode side, and FIG. 1C is a plan view seen on an external terminal side. Additionally, since portions indicating characteristics of the present invention are shown in an exaggerated form, dimension ratios in the drawings are not constant.

For the semiconductor device, a semiconductor chip 50 and a substrate 60 for packaging the chip in a printed wiring board are sealed with a seal resin 72 to constitute a package.

For the semiconductor chip 50, a predetermined logic circuit is formed in a circuit forming surface of a semiconductor substrate 51, and a plurality of peripheral pads 52 (this pad is also called as electrode pad) for terminals are disposed in a chip periphery, for example, at an interval of 50 $\mu$m. An insulating layer 53 is formed substantially entirely on the circuit forming surface of the semiconductor substrate 51 so that a part of each peripheral pad 52 is exposed, and a plurality of re-distribution wirings 54 connected to the respective peripheral pads 52 are formed in the surface of the insulating layer 53.

One ends of the respective re-distribution wirings 54 are extended to the positions where metal posts 55 (metal post is also referred to as a conductive post or a bump electrode) are formed and where the semiconductor chip 50 is connected to a substrate 60.

The metal post 55 having a height of about 100 $\mu$m is disposed on the one end of each re-distribution wiring 54. It is to be noted that the metal posts 55 are disposed at an interval, for example, of 300 $\mu$m in a lattice form.

On the other hand, for the substrate 60, pads 62 (substrate pads) to be disposed opposite-to the metal posts 55 of the semiconductor chip 50 are formed in the chip mounting surface of a base material 61 by a glass epoxy resin having a thickness, for example, of 310 $\mu$m, and lands 63 and solder balls 64 constituting external terminals are formed in a package surface of the substrate onto the printed wiring board. The external terminals such as the solder balls 64 are disposed at an interval, for example, of 500 $\mu$m in the lattice form. The pad 62 of the chip mounting surface is electrically connected to the corresponding land 63 of the package surface via an internal wiring 65 (this wiring is also referred to as a conductive trace) formed in the chip mounting surface and a through hole 66 formed through the base material 61.

Furthermore, the tip ends of the metal posts 55 of the semiconductor chip 50 are electrically and mechanically fixed/connected to the corresponding pads 62 of the substrate 60 via internal bond portions 71. Moreover, the chip mounting surface of the substrate 60 and the semiconductor chip 50 mounted on the chip mounting surface are sealed by the seal resin 72 to form an outer shape of the package including the internal bond portions 71.

Figure 3:
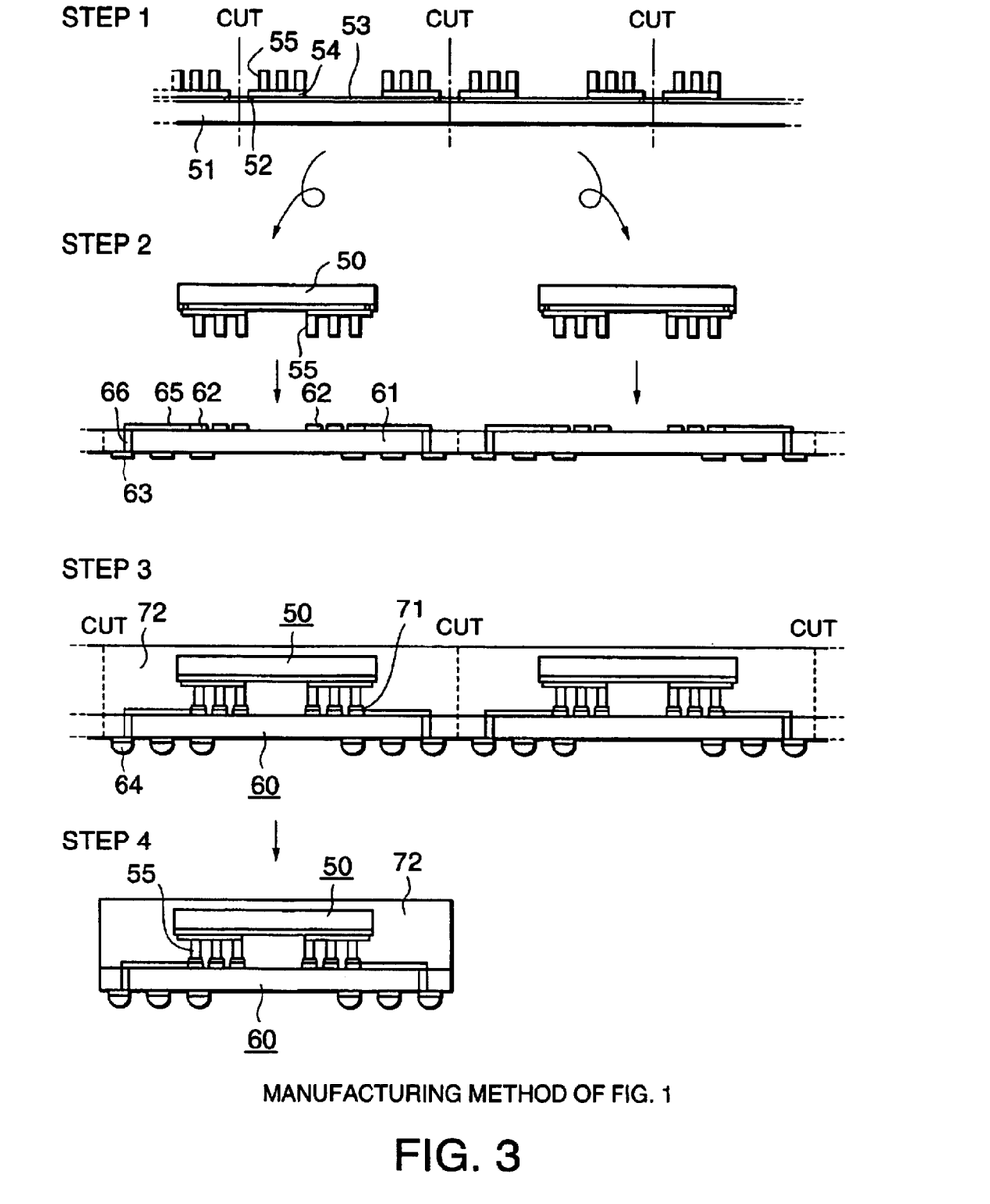
FIG. 3 is a process diagram showing a manufacturing method of the semiconductor device of FIG. 1.

FIG. 3 is a process diagram showing a manufacturing method of the semiconductor device of FIG. 1. A manufacturing method of the semiconductor device of FIG. 1 will be described hereinafter with reference to FIG. 3.

(1) Step 1

A predetermined logic circuit corresponding to a plurality of semiconductor chips 50 is formed on the circuit forming surface of the semiconductor substrate 51 in the wafer state. Moreover, a plurality of peripheral pads 52 for terminals are formed around the logic circuit by a conventional circuit forming method.

Next, the insulating layer 53 is formed substantially entirely on the upper surface of the semiconductor substrate 51 so as to expose the surfaces of the peripheral pads 52. This insulating layer 53 is formed by successively performing treatments such as application of varnish having photosensitivity, tentative hardening, photolithography, development, and main hardening.

Furthermore, after forming the re-distribution wirings 54 on the surfaces of the peripheral pads 52 and insulating layer 53 by using a sputtering process, the metal posts 55 are formed in the predetermined positions of the one ends of the re-distribution wirings 54 by using a plating process.

(2) Step 2

The semiconductor substrate 51 in the wafer state is cut by a scribing process using an ultrathin blade to whose surface micro particles of diamond are fixed/attached, and divided into the individual semiconductor chips 50.

Aside from this, the base material 61 made from a glass epoxy resin is prepared. The base material 61 has the chip mounting surface on which the pads 62 and the internal wirings 65 are formed, and the package surface on which the lands 63 are formed. The internal wirings 65 are electrically connected to the lands 63 via through holes 66 which is provided in the base material 61. After that, the metal posts 55 of the divided semiconductor chips 50 are positioned and connected to the corresponding pads 62.

For a method of connecting the metal posts 55 to the pads 62, for example, any of the following methods may also be used.

① The method comprises: using the metal posts 55 by Cu and the pads 62 by Cu plated with Ni/Au to subject a surface to be bonded to an Ar fast atom beam (FAB) or Ar plasma treatment before the bonding and to form a normal surface; and performing the bonding at room temperature in a high vacuum or pressurizing/bonding at a high temperature in a low vacuum or a constant pressure to form the internal bond portions 71 by Cu—Au junction.

②The method comprises: using the metal posts 55 by Cu plated with Ni/Au and the pads 62 by Cu in the tip-end portions to form the internal bond portions 71 by the Cu—Au junction in the same method as ①).

③The method comprises: using the metal posts 55 and pads 62 by Sn to form the internal bond portions 71 by pressurization at the high temperature.

④The method comprises: using the metal posts 55 in which an Au layer is formed in the tip end of Cu (via a barrier metal layer by Ni if necessary) or the metal posts 55 by Au and the pads 62 in which an Ni/Au layer is formed to form the internal bond portions 71 by the pressurization at the high temperature or by also using ultrasonic waves.

⑤The method comprises: using the metal posts 55 in which an Sn—Ag layer is formed and the pads 62 in which the Ni/Au layer is formed to form the internal bond portions 71 by the pressurization at the high temperature or by also using the ultrasonic waves.

⑥The method comprises: using the metal posts 55 in which the Au layer is formed in the tip end of Cu (via the barrier metal layer by Ni if necessary) and the pads 62 in which the Sn—Ag layer is formed to form the internal bond portions 71 by the pressurization at the high temperature or by also using the ultrasonic waves.

(3) Step 3

The seal resin 72 is poured into the chip mounting surface of the substrate 60 connected to the semiconductor chip 50 to coat the semiconductor chip 50 and internal bond portions 71 for collective sealing. Alternatively, a metal mold having individual cavities is used, and the seal resin 72 is injected into the mold to individually seal the cavities.

After the seal treatment, ball-shaped solders are mounted on the lands 63 in the package surface of the substrate 60, and the solder balls 64 which are the external terminals are formed by the reflow.

(4) Step 4

The seal resin 72 and substrate 60 are cut/individualized by the scribe process using the ultrathin blade to whose surface the micro particles of diamond are fixed/attached, and the individual semiconductor devices are completed.

The semiconductor device is packaged in the printed wiring board of an apparatus into which the device is to be assembled by the solder balls 64 of the external terminals. Moreover, a signal or power from the printed wiring board is successively propagated through the solder balls 64, metal posts 55, re-distribution wirings 54, and peripheral pads 52, and inputted into the integrated circuit of the semiconductor chip 50. Furthermore, the signal outputted from the integrated circuit is propagated in the same path in reverse and supplied to the printed wiring board.

As described above, the semiconductor device of the first embodiment has the following advantages.

(i) In the semiconductor chip 50, the peripheral pads 52 for the terminals arranged at narrow pitches are connected to the metal posts 55 arranged at an enlarged pitch of about 300 µm by the re-distribution wirings 54, and fixed/connected to the pads 62 on a substrate 60 side by the metal posts 55. Accordingly, since the interval of the connected portions of the substrate 60 can be widened, it is not necessary to perform the wire bonding. Without requiring expensive substrates such as a built-up substrate in which a plurality of wiring layers are formed via the insulating layer, the general inexpensive substrate 60 can be used, and a capability superior in an electric characteristic can be imparted.

(ii) In the package surface of the substrate 60, the external terminals are arranged at the enlarged pitch of about 500 µm in order to package the substrate in the printed wiring board.

The external terminals are connected to the pads 62 on the chip mounting surface of the substrate 60 via the internal wirings 65 and through holes 66. Accordingly, even the high-density semiconductor chip 50 including a large number of terminals can securely be mounted in the printed wiring board.

(iii) The semiconductor chip 50 is fixed/connected to the substrate 60 by the metal posts 55 without using the adhesive. Accordingly, the semiconductor device which is superior in water vapor resistance and reflow resistance can be obtained without being influenced by the moisture contained in the adhesive.

(iv) The semiconductor chip 50 is connected to the substrate 60 by the metal posts 55, and the whole semiconductor chip 50 on the substrate 60 including the metal posts 55 is sealed with the seal resin 72. Accordingly, the semiconductor device having high reliability is obtained.

Second Embodiment

Figure 4:
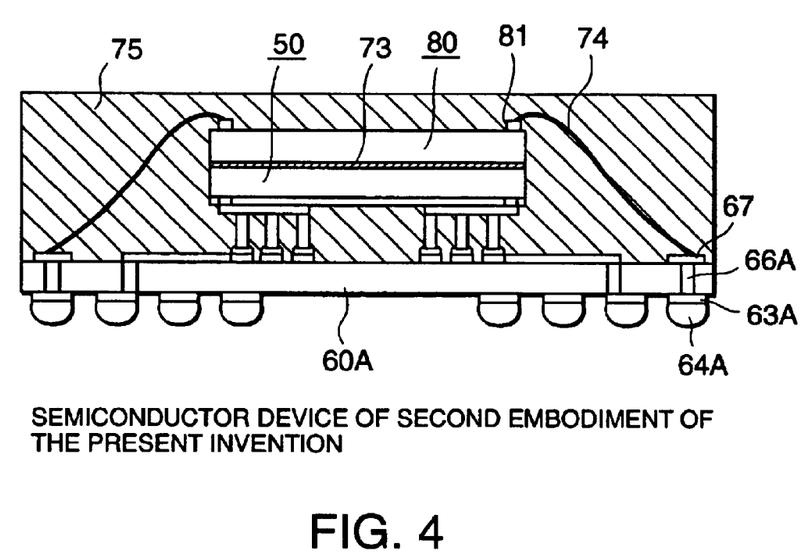
FIG. 4 is a sectional view of the semiconductor device according to a second embodiment of the present invention.

FIG. 4 is a sectional view of the semiconductor device according to a second embodiment of the present invention. Elements common with those in FIG. 1 are denoted with the same reference numerals.

This semiconductor device is constituted of a second semiconductor chip 80 mounted on a first semiconductor chip 50. The semiconductor chip 80 is attached to the semiconductor chip 50 back to back by an adhesive 73, and pads 81 for the terminals are disposed on the circuit forming surface.

On the other hand, a substrate 60A of this semiconductor device is formed to be one size larger than the substrate 60 in FIG. 1. Lands 63A and solder balls 64A constituting the external terminals for connecting the pads 81 of the semiconductor chip 80 to the outside are disposed in an enlarged portion of the substrate. Bonding posts 67 are formed in the chip mounting surface of the substrate 60A so that the posts are disposed opposite to the lands 63A. The lands 63A are connected to the bonding posts 67 by through holes 66A.

Although not shown, wiring patterns or bonding posts are disposed in the chip mounting surface of the substrate 60A in order to connect the pads 81 of the second semiconductor chip 80 to the metal posts 55 of the first semiconductor chip 50 inside the device.

The pads 81 of the semiconductor chip 80 are connected to the corresponding bonding posts 67 of the substrate 60A via metal fine wires 74. The other structure is similar to that of FIG. 1. Moreover, the semiconductor chips 50, 80, and metal fine wires 74 are sealed with a seal resin 75.

This semiconductor device is manufactured by: fixing/connecting the first semiconductor chip 50 to the chip mounting surface of the base material 61 of a glass/epoxy resin in which the patterns of the plurality of substrates 60A; bonding the second semiconductor chip 80 onto the semiconductor chip 50 by the adhesive 73; bonding-connecting the pads 81 of the semiconductor chip 80 to the bonding posts 67 of the substrate 60A by the metal fine wires 74; and sealing the chips and fine wires with the seal resin 75.

This semiconductor device is packaged in the printed wiring board of the apparatus into which the device is to be assembled by the solder balls 64, 64A of the external terminals in the same manner as in the first embodiment. Moreover, the signal or power from the printed wiring board is propagated through the solder balls 64, lands 63, through holes 66, pads 62, internal bond portions 71, metal posts 55, re-distribution wirings 54, and peripheral pads 52 in order, and inputted into the integrated circuit of the first semiconductor chip 50. Furthermore, the signal outputted from this integrated circuit is propagated in the same path in reverse and supplied to the printed wiring board.

On the other hand, the signal with respect to the second semiconductor chip 80 is propagated through the solder balls 64A, lands 63A, through holes 66A, bonding posts 67, metal fine wires 74, and pads 81 in order from the printed wiring board, and inputted into the integrated circuit of the second semiconductor chip 80. Additionally, the signal outputted from this integrated circuit is propagated in the same path in reverse and supplied to the printed wiring board.

As described above, for the semiconductor device of the second embodiment, two semiconductor chips 50 and 80 are attached to each other back to back and mounted on the substrate 60A. Accordingly, it is possible to constitute the semiconductor device which has advantages similar to those of the first embodiment and has a large circuit scale without substantially increasing a package area.

It is to be noted that the present invention is not limited to the above-described embodiments, and can variously be modified. Modification examples are as follows.

(a) In the step 2 of FIG. 3, when the semiconductor chip 50 is mounted on the substrate 60, the method of bringing the metals of the metal post 55 and pad 62 into direct contact with each other to form the internal bond portion 71 is used. However, a conductive paste may also be used to electrically and mechanically connect the metal posts 55 to the pads 62.

Accordingly, the conductive paste can absorb the dispersion of the height of the metal post 55, and it is possible to enhance yield of connection and to increase reliability. Moreover, the connection is possible at room temperature/low pressure, and therefore damage can be reduced with respect to the semiconductor chip 50. Furthermore, since a pressurization time is not required at the mounting time, enhancement of productivity can be expected.

(b) In the step 2 of FIG. 3, the method of bringing the metal posts 55 of the semiconductor chip 50 into direct contact with the pads 62 of the substrate 60 to form the internal bond portions 71. However, a solder paste may be used to electrically and mechanically connect the metal posts 55 to the pads 62 by methods such as the reflow. Thereafter, flux components may also be cleaned and removed if necessary.

Accordingly, the solder can absorb the dispersion of the height of the metal post 55, and it is possible to enhance the yield of connection and the reliability. Moreover, since the pressure does not have to be applied at the mounting time, the damages can be reduced with respect to the semiconductor chip 50. Furthermore, since the pressurization time is not required, the enhancement of productivity can be expected. Additionally, because of the solder bonding, conduction resistance is small and electrically superior characteristics can be obtained.

(c) The ball grid array (BGA) structure has been described in which the solder balls 64 are formed as the external terminals in the package surface of the substrate 60, but the present invention can also be applied to a land grid array (LGA) structure in which there is not any solder ball.

(d) The semiconductor device of a saw cut type, in which the substrate has the same lengthwise/crosswise dimensions as those of the sealed portion, has been described. However, the present invention can also be applied to the semiconductor device in which the outer shape of the sealed portion is smaller than that of the substrate and which includes the individual cavities and which is molded/sealed in the metal mold.

(e) As the sealing method by the seal resin 72, the method by transfer mold has been described in which a solid resin is used to inject the resin into the metal mold (the resin is in a liquid form at an injection temperature). However, it is also possible to apply a pressurization molding method using the solid resin (in the liquid form at a molding temperature), a casting method using the liquid resin, a printing method, and a vacuum printing method.

(f) The back surface of the semiconductor chip 50 of FIG. 1 is coated with the seal resin 72, but the back surface may also be exposed in the structure. Accordingly, the effect of reduction of heat resistance can be expected.

As described above in detail, according to the first aspect of the present invention, for the semiconductor chip, the peripheral pads are connected to the conductive posts for mounting the substrate via the re-distribution wirings. For the substrate, the substrate pads are connected to the external terminals via the internal wirings. Accordingly, it is possible to easily adjust the interval between the external terminals to that between the pads of the print substrates, and a large number of terminals can securely be connected. Furthermore, the semiconductor chip is fixed/connected to the substrate via the conductive posts without using the adhesive, and the water vapor resistance and reflow resistance are therefore superior.

According to the second aspect of the present invention, the first and second semiconductor chips are bonded to each other back to back and mounted on the substrate. Accordingly, in addition to the effect of the first aspect of the present invention, there is an effect that the semiconductor device having a large circuit scale can be constituted without substantially increasing the mounting area.

According to the third aspect of the present invention, the interval between the conductive posts is constituted to be wider than that between the peripheral pads, and the interval between the external terminals is constituted to be wider than that between the conductive posts. Accordingly, even when the interval between the peripheral pads of the semiconductor chip is small, the interval between the external terminals can easily be enlarged without using any expensive substrate.

According to the fourth and fifth aspects of the present invention, the semiconductor chip is connected to the substrate via the conductive posts, and the substrate and semiconductor chip are further sealed with the resin. Accordingly, since the substrate and semiconductor chip are sealed with the resin, and the adhesive containing the moisture does not exist, the semiconductor device superior in the water vapor resistance and reflow resistance can be obtained.

According to the sixth aspect of the present invention, the substrate pads may be bonded to the conductive posts by the conductive adhesive or solder. Accordingly, the dispersion of the height of the conductive post is absorbed and it is possible to enhance the yield of connection and the reliability. It is further possible to connect the semiconductor chips to each other without adding any pressure, and it is also possible to reduce the damages with respect to the semiconductor chip and to shorten a connection time.

What is claimed is:

1. A semiconductor device comprising:
   a substrate having a chip mounting surface and a package surface;
   a semiconductor chip mounted on the chip mounting surface;

wherein the semiconductor chip includes;
a plurality of electrode pads formed on a circuit forming surface of the semiconductor chip,
an insulating layer which is formed on the circuit forming surface and which includes an opening for exposing a part of the surface of each electrode pad,
a plurality of conductive posts disposed over the insulating layer, and
re-distribution wirings formed on the insulating layer to electrically connect the conductive posts to the electrode pads,
external terminals disposed on the package surface;
substrate pads formed on the chip mounting surface so as to correspond the conductive posts;
internal wirings formed on the chip mounting surface to electrically connect the substrate pads and the external terminals; and
a sealing resin for sealing the chip mounting surface and the semiconductor chip.

2. The semiconductor device according to claim 1, wherein the interval between the conductive posts is wider than that between electrode pads, and the interval between the external terminals is wider than that between the conductive posts.

3. The semiconductor device according to claim 1, wherein a back surface of the semiconductor chip is exposed.

4. The semiconductor device according to claim 1, wherein the external terminals comprise solder balls.

5. A semiconductor device
a substrate having a chip mounting surface and a package surface;
a first semiconductor chip mounted on the chip mounting surface;
wherein the first semiconductor chip includes;
a plurality of first electrode pads formed on a first circuit forming surface of the first semiconductor chip,
an insulating layer which is formed on the first circuit forming surface and which includes an opening for exposing a part of the surface of each first electrode pad,
a plurality of conductive posts disposed over the insulating layer, and
re-distribution wirings formed on the insulating layer to electrically connect the conductive posts to the first electrode pads,
a second semiconductor chip mounted on a back surface of the first semiconductor chip and having a plurality of second electrode pads formed on a second circuit forming surface of the second semiconductor chip;
external terminals provided on the package surface;
substrate pads formed on the chip mounting surface so as to correspond the conductive posts;
bonding posts formed on the chip mounting surface;
bonding wires for connecting the second electrode pads to the bonding posts;
internal wirings formed on the chip mounting surface for electrically connecting the substrate pads and the bonding posts to the external terminals; and
a sealing resin for sealing the chip mounting surface, the bonding wires, and the first and second semiconductor chips.

6. The semiconductor device according to claim 5, wherein the interval between the conductive posts is wider than that between first electrode pads, and the interval between the external terminals is wider than that between the conductive posts.

7. The semiconductor device according to claim 5, wherein the external terminals comprise solder balls.

8. A semiconductor device comprising:
a substrate having a first surface and a second surface opposed to the first surface;
a semiconductor chip having a third surface and a fourth surface opposed to the third surface, and mounted on the first surface;
wherein the semiconductor chip includes;
a plurality of electrode pads formed on the third surface,
an insulating layer which is formed on the third surface and which includes an opening for exposing a part of the surface of each electrode pad,
a plurality of bump electrodes disposed over the insulating layer, and
wirings formed on the insulating layer to electrically connect the bump electrodes to the electrode pads,
external terminals disposed on the second surface;
substrate pads formed on the first surface;
conductive traces formed on the first surface to electrically connect the substrate pads and the external terminals; and
a sealing resin for sealing the first surface and the semiconductor chip.

9. The semiconductor device according to claim 8, wherein the interval between the bump electrodes is wider than that between electrode pads, and the interval between the external terminals is wider than that between the bump electrodes.

10. The semiconductor device according to claim 8, wherein the fourth surface of the semiconductor chip is exposed.

11. The semiconductor device according to claim 8, wherein the external terminals comprise solder balls.

12. A semiconductor device
a substrate having a first surface and a second surface opposed to the first surface;
a first semiconductor chip having a third surface and a fourth surface opposed to the third surface, and mounted on the first surface;
wherein the first semiconductor chip includes;
a plurality of first electrode pads formed on the third surface,
an insulating layer which is formed on the third surface and which includes an opening for exposing a part of the surface of each first electrode pad,
a plurality of bump electrodes disposed over the insulating layer, and
wirings formed on the insulating layer to electrically connect the bump electrodes to the first electrode pads,
a second semiconductor chip having a fifth surface and a sixth surface opposed to the fifth surface and having a plurality of second electrode pads formed on the fifth surface, the sixth surface being mounted on the fourth surface;
external terminals provided on the second surface;
substrate pads formed on the first surface;
bonding pads formed on the first surface;
bonding wires for connecting the second electrode pads to the bonding terminals;

conductive traces formed on the first surface for electrically connecting the substrate pads and the bonding pads to the external terminals; and a sealing resin for sealing the first surface, the bonding wires, and the first and second semiconductor chips.

13. The semiconductor device according to claim 12, wherein the interval between the bump electrodes is wider than that between first electrode pads, and the interval between the external terminals is wider than that between the bump electrodes.

14. The semiconductor device according to claim 12, wherein the external terminals comprise solder balls.

* * * * *